United States Patent [19]

Ashida

[11] Patent Number: 5,262,655

[45] Date of Patent: Nov. 16, 1993

[54] THIN FILM FIELD EFFECT DEVICE HAVING AN LDD STRUCTURE AND A METHOD OF MANUFACTURING SUCH A DEVICE

[75] Inventor: Motoi Ashida, Hyogo, Japan

[73] Assignee: Mitsubishi Denki Kabushiki Kaisha, Tokyo, Japan

[21] Appl. No.: 852,879

[22] Filed: Mar. 17, 1992

[30] Foreign Application Priority Data

Apr. 23, 1991 [JP] Japan ................................ 3-91819

[51] Int. Cl.$^5$ ................ H01L 29/10; H01L 21/265
[52] U.S. Cl. .................................. 257/66; 257/335; 257/336; 257/347; 257/352; 257/408; 257/412; 257/618; 437/43; 437/46; 437/141; 437/228; 437/913
[58] Field of Search ............... 357/23.4, 23.7, 23.9; 437/43, 46, 141, 228, 913; 257/335, 336, 347, 352, 408, 412, 618

[56] References Cited

U.S. PATENT DOCUMENTS

| 4,502,202 | 3/1985 | Malhi | 357/23.9 |
| 4,628,589 | 12/1986 | Sundaresan | 357/23.7 |
| 4,845,046 | 7/1989 | Shimbo | 357/23.9 |
| 5,115,288 | 5/1992 | Manley | 357/23.9 |

OTHER PUBLICATIONS

Patent Abstracts of Japan, vol. 013, No. 078 (E-718) Feb. 22, 1989 and JP-A-63 260 162 (NEC Corp) Oct. 27, 1988.
Patent Abstracts of Japan, vol. 013, No. 459 (E-832) Oct. 17, 1989 & JP-A-11 79 367 (Kodama Noriaki) Jul. 17, 1989.
EP-A-0 312 955 (NEC Corporation) abstract; FIG. 3.
IEEE Electron Device Letters, vol. DL8, No. 9, Sep. 1987, New York US pp. 425-427 Shunji Seki et al., "Laser-Recrystallized Polycrystalline-Silicon Thin-Film Transistors with Low Leakage Current and High Switching Ratio", abstract; FIG. I.
Patent Abstract of Japan vol. 010, No. 011 (e-374) Jan. 17, 1896 and JP≧A-60 173 875 (Toshiba KK) 7 Sep. 1985 abstract.
"A 25 m$^2$ New Poly-Si PMOS Load (PPL) SRAM Cell having Excellent Soft Error Immunity", *International Electron Device Meeting*, by T. Yamanaka et al, 1988 IEEE, pp. 48-51.
Journal of Applied Physics, vol. 65, No. 6, Mar. 15, 1989, New York US pp. 2541-2546.

*Primary Examiner*—Edward Wojciechowicz
*Attorney, Agent, or Firm*—Lowe, Price, LeBlanc & Becker

[57] ABSTRACT

A thin film transistor has gate electrode formed on a surface of insulating layer. The gate electrode has its upper surface covered with gate insulating layer and its side walls covered with sidewall oxide film by a thermal oxidation. Dual sidewall conductive layers of a polycrystalline silicon are formed on side walls of the sidewall oxide film. Impurities of a higher concentration and of a lower concentration are introduced to each of the dual sidewall conductive layers. A polycrystalline silicon layer is formed on surfaces of the gate electrode, the gate insulating layer and the like. Channel region is formed in the polycrystalline silicon layer positioned above the gate electrode. Source/drain region has source/drain regions having an LDD structure formed by a thermal diffusion from the dual sidewall conductive layers each having impurities of a higher concentration and a lower concentration.

12 Claims, 9 Drawing Sheets

THIN FILM FIELD EFFECT DEVICE HAVING AN LDD STRUCTURE AND A METHOD OF MANUFACTURING SUCH A DEVICE

BACKGROUND OF THE INVENTION

1. Field of the Invention

The present invention relates to a transistor structure which may improve a gate breakdown voltage of a thin film transistor using a thin polycrystalline silicon layer as a channel layer, and to a manufacturing method thereof.

2. Description of the Background Art

A so-called thin film transistor (TFT) is one type of insulated gate field effect transistors configured to have a semiconductor thin film formed on an insulating substrate and a channel region provided in this thin film.

FIG. 16 shows a view of cross-sectional structure of a conventional thin film transistor, which is disclosed, for example, in *International Electron Device Meeting*, 1988. Referring to FIG. 16, a conventional thin film transistor includes a gate electrode 41 of a polycrystalline silicon layer formed on the surface of an insulating substrate or insulating layer 40. A gate insulating layer 42 such as of an approximately 250-thick oxide film is formed on surfaces of insulating substrate 40 and gate electrode 41. A polycrystalline silicon layer 43 with a thickness of approximately 30 nm is formed on the surface of gate insulating layer 42. Polycrystalline silicon layer 43 includes a pair of source/drain regions 45, 45 and a channel region 44 formed therebetween.

A manufacturing process of a thin film transistor will now be described. FIGS. 17 to 20 are views of cross-sectional structures showing in order steps of a manufacturing process of a thin film transistor shown in FIG. 16.

First, as shown in FIG. 17, after forming a polycrystalline silicon layer on the surface of insulating substrate 40, a photolithography method and an etching method are used to pattern the layer in a predetermined shape. According to this process, gate electrode 41 is formed.

Second, as shown in FIG. 18, an approximately 40 nm-thick oxide film, for example, is deposited on the whole surface using a low pressure CVD (Chemical Vapor Deposition) method. This oxide film constitutes gate insulating film 42.

Next, as shown in FIG. 19, approximately 30 nm-thick polycrystalline layer 43 is deposited on the surface of gate insulating film 42 using a low pressure CVD method.

Finally, as shown in FIG. 20, a resist mask 50 is formed on a region to be a channel of polycrystalline silicon layer 43. Impurity ions 51 are ion-implanted into polycrystalline silicon layer 43 using resist mask 50 as mask, thereby forming a pair of source/drain regions 45, 45. Then the implanted ions are activated by a thermal treatment.

According to the above described process, a thin film transistor shown in FIG. 16 is provided.

However, since a conventional thin film transistor is configured by source/and drain regions 45, 45 of a single layer having a higher concentration, a steep impurity concentration distribution is provided in boundaries between source/drain regions 45, 45 and channel region 44. As a result, when a predetermined voltage is applied between source 45 and drain 45 regions, a field concentration occurs in the vicinity of the drain region. In addition, polycrystalline silicon layer 43 includes many defect levels such as in a grain boundary of a crystal. Therefore, when a field concentration occurs in the vicinity of the drain region, a field emission of carriers is accelerated through these defect levels, resulting in a problem that a drain leakage depending on a drain voltage increases.

SUMMARY OF THE INVENTION

One object of the present invention is to reduce a drain leakage caused by a field concentration in a thin film field effect device.

Another object is to provide a thin film field effect transistor having a source/drain region of an LDD structure.

Still another object is to provide a method of manufacturing a thin film field effect transistor having a source/drain region of an LDD structure.

A thin film field effect device according to the present invention is provided with a gate electrode formed on an insulating base layer, an insulating layer covering upper and side surfaces of the gate electrode, and a polycrystalline silicon layer formed on the surface of the insulating layer. The polycrystalline silicon layer includes a pair of source/drain regions provided with a channel region, an impurity region of a lower concentration adjacent the channel region, and an impurity region of a higher concentration adjacent the impurity region of a lower concentration.

A method of manufacturing a thin film field effect device according to the present invention includes the following steps. First, a gate electrode having upper and side surfaces covered with an insulating layer is formed on a base layer. Next, after forming a first conductive layer containing impurities of a relatively lower concentration on the whole surface of a base layer, a first sidewall conductive layer is provided on side walls of the insulating layer formed on the gate electrode by an anisotropic etching. After forming a second conductive layer containing impurities of a relatively higher concentration on the whole surface of the base layer, a second sidewall conductive layer is formed on side walls of the first sidewall conductive layer by an anisotropic etching. Then, the second sidewall conductive layer is etched using an etching method having a larger selectivity of etching relative to the first sidewall conductive layer, the insulating layer and the base layer, whereby the surface of the first sidewall conductive layer is exposed. Next, a silicon layer is formed on surfaces of the first and second sidewall conductive layers and the base layer. Finally, diffusion of impurities contained in the first and second conductive layers to a polycrystalline silicon layer by a thermal treatment provides a source/drain region including impurity regions of lower and higher concentrations.

A thin film field effect element according to the present invention is provided with a so-called LDD (Lightly Doped Drain) structure in a source/drain region. An impurity region of a lower concentration alleviates a field concentration by rendering gentle an impurity concentration distribution in the vicinity of a channel region. This suppresses drain leakage in the vicinity of a drain region.

An LDD structure in a source/drain region is formed by thermal diffusion of impurities from dual sidewall conductive layers formed on side walls of a gate electrode. This makes it possible to make an LDD structure by a simple manufacturing method without using a mask process and the like.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
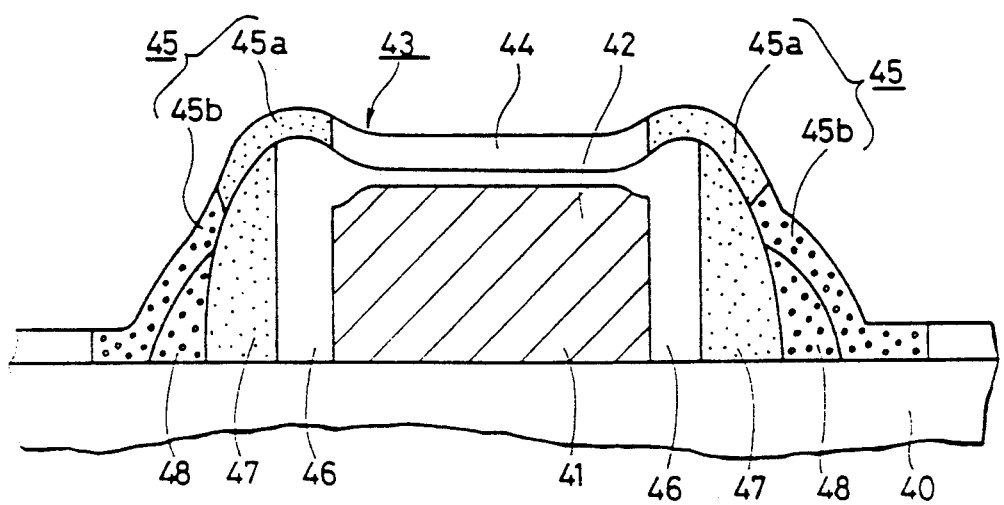
FIG. 1 is a view of a cross-sectional structure of a thin film transistor according to a first embodiment of the present invention.

Referring to FIG. 1, base layer 40 of an insulating layer or insulating substrate has gate electrode 41 of a polycrystalline silicon layer formed on the surface thereof. Impurities are introduced inside gate electrode 41 to provide conductivity. Gate electrode 41 includes gate electrode insulating layer 42 of such as a silicon film formed on the surface and sidewall insulating layers 46, 46 formed on side walls. Sidewall insulating layer 46 is formed by a thermal oxidation method, the thickness of which is larger than that of gate insulating layer 42. First and second conductive layers 47 and 48 are formed on the side walls of each of sidewall insulating layers 46. First and second sidewall conductive layers 47 and 48 are each made of a polycrystalline silicon, inside of which impurities of a predetermined concentration are introduced. Polycrystalline silicon layer 43 is formed on surfaces of base layer 40, first and second sidewall conductive layers 47, 48, sidewall insulating layers 46 and gate insulating layer 42. Polycrystalline silicon layer 43 includes channel region 44 and source/drain regions 45, 45 formed at predetermined positions inside thereof. Channel region 44 is provided in a position almost opposite gate electrode 41 with gate insulating layer 42 interposed therebetween. Channel region 44 includes p$^-$ impurity regions 45a, 45a formed on both sides and p$^+$ impurity regions 45b, 45b on both sides of the p$^-$ impurity regions 45a, 45a. In other words, source/drain region 45 has a so-called LDD structure including p$^-$ impurity region 45a and p$^+$ impurity region 45b.

An LDD structure of source/drain region 45 alleviates a field concentration in the source/drain region, particularly in the vicinity of the drain region by constituting a gentle impurity concentration distribution. In addition, sidewall insulating layers 46 has a larger thickness at an edge portion of gate electrode 41. This makes it possible to suppress a field concentration at the edge portion of gate electrode 41.

A manufacturing process of a thin film transistor shown in FIG. 1 will now be described.

Figure 2:
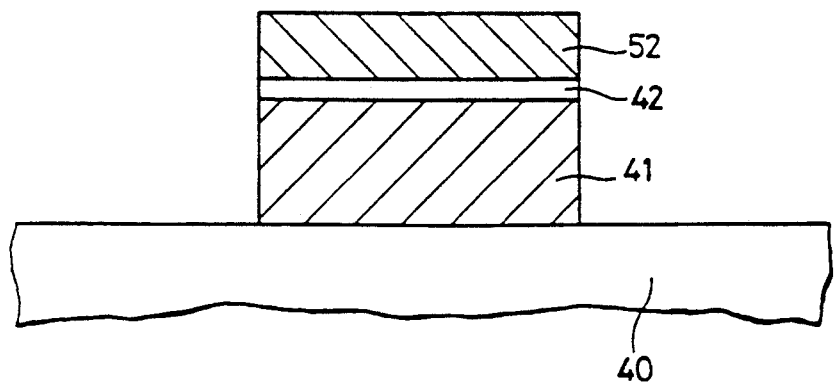
FIGS. 2-7 are views of cross-sectional structures showing in order steps of a manufacturing process of a thin film transistor shown in FIG. 1.

First of all, as shown in FIG. 2, a polycrystalline silicon layer with a thickness of 150-250 nm is formed on the surface of base layer 40 of such as an interlayer insulating layer using a low pressure CVD method. A silicon oxide film with a thickness of 20-50 nm is formed on the surface of the polycrystalline silicon layer using a CVD method. A silicon nitride film is formed on the surface of the silicon oxide film using a CVD method. Then, these films are patterned to form gate electrode 41, gate insulating layer 42 and a silicon nitride film 52 using a photolithography method and an etching method.

Figure 3:
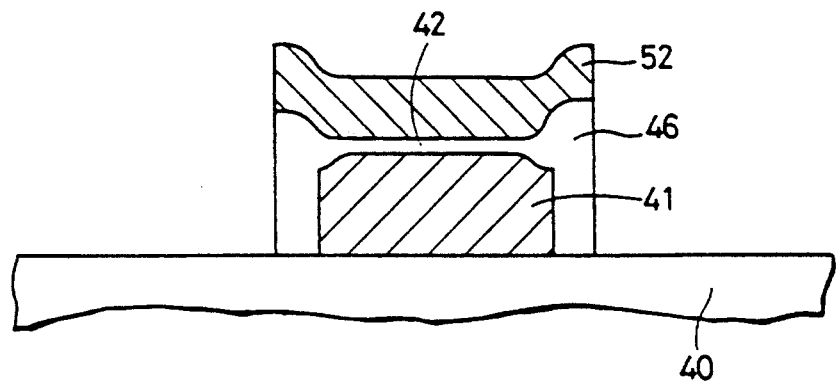

Second, as shown in FIG. 3, sidewall insulating layer 46 is formed on side walls of gate electrode 41 using a thermal oxidation method. When sidewall insulating layer 46 with a thickness, for example, of 50 nm is formed, it is subjected to a thermal oxidation treatment in a wet O$_2$ atmosphere at a temperature of 850° C. approximately for two hours. Silicon nitride film 52 has an oxidation resistance. Therefore, most of gate insulating layer 42 covered with silicon nitride film 52 is not oxidized.

Figure 4:
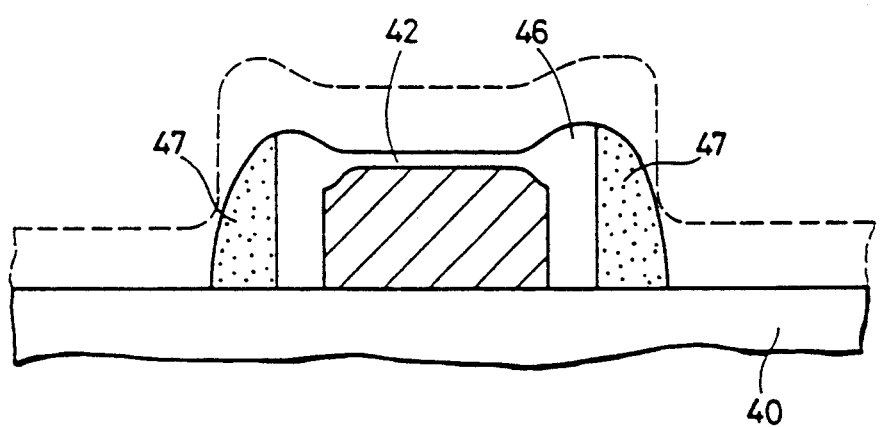

Third, as shown in FIG. 4, after removal of silicon nitride film 52, a polycrystalline silicon layer doped with boron is formed over the whole surface of the base layer 40 using a CVD method. The concentration of boron contained in the polycrystalline silicon layer is $2 \times 10^{18}$–$5 \times 10^{19}$/cm$^3$. First sidewall conductive layers 47, 47 are formed only on side walls of sidewall insulating layers 46 by etching the polycrystalline silicon layer using an anisotropic etching method.

Figure 5:
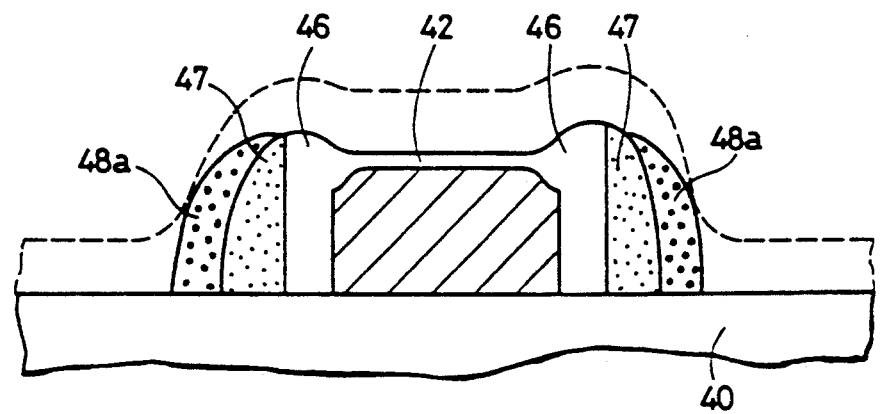

Next, as shown in FIG. 5, a poly crystalline silicon layer containing impurities of such as boron is again formed over the whole surface of the base layer 40 using, for example, a CVD method. The concentration of boron contained in the polycrystalline layer is $2 \times 10^{19}$–$5 \times 10^{20}$/cm$^3$, which is higher than that of sidewall conductive layers 47. Second sidewall conductive layers 48a, 48a are formed only on side walls of first sidewall conductive layers 47 by an anisotropic etching of the polycrystalline layer.

Figure 6:
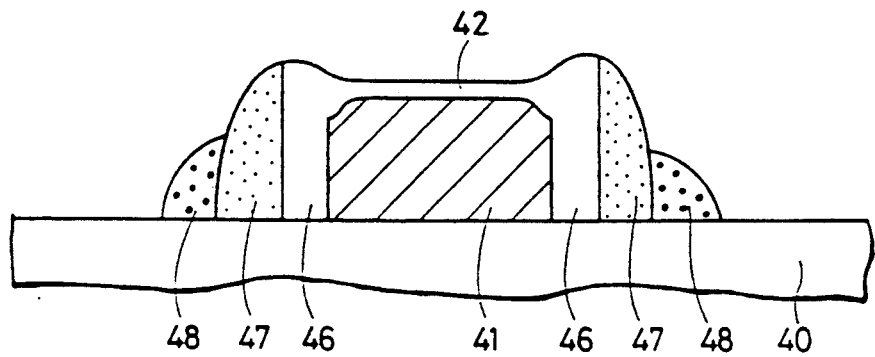

Next, as shown in FIG. 6, second sidewall conductive layers 48 are particularly etched by a dry etching, for example, using CF$_4$ gas. This dry etching has a different selectivity of etching depending on a difference in amounts of doped impurities of such as boron contained in polycrystalline layers. Therefore, in the case shown in FIG. 6, second sidewall conductive layers 48 doped to a higher concentration are etched to a greater level than first sidewall conductive layers 47 doped to a lower concentration. This causes surfaces of first sidewall conductive layers 47 to be exposed, thereby producing a step at surfaces of first sidewall conductive layers 47 and of second sidewall conductive layers 48.

Figure 7:
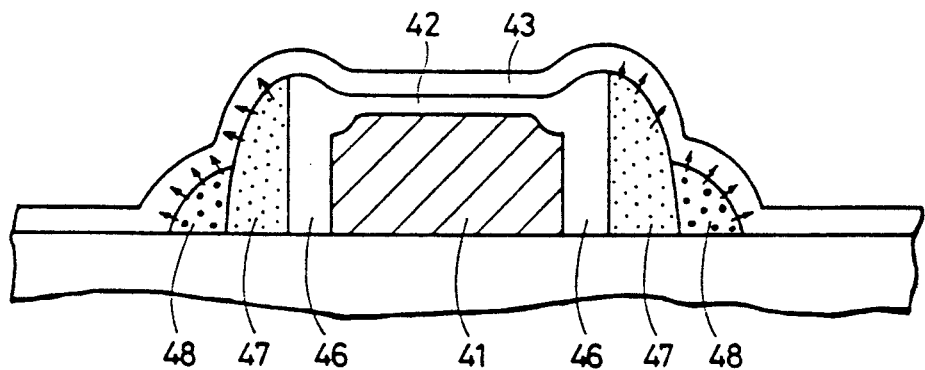

Finally, as shown in FIG. 7, polycrystalline silicon layer 43 with a thickness of approximately 20-50 nm is formed over the whole surface of the base layer 40 using, for example, a CVD method. The following methods may also be employed to form polycrystalline silicon layer 43. In a first method, an amorphous silicon layer is formed over the whole surface of the base layer 40. Then, a polycrystalline silicon layer is formed by solid phase growth of the amorphous silicon by a thermal treatment at a temperature of 600° C. for approximately 10 hours. In a second method, after having a polycrystalline silicon layer formed using a CVD method, the polycrystalline silicon layer is made amorphous by ion-implanting silicon ions. Then, a polycrystalline silicon layer is formed by the same solid phase growth as that in the first method. The first and second methods are intended to increase a grain size of polycrystalline silicon layer 43. Since a trap level decreases in accordance with an increase in an grain size, it is possible to increase the number of effective carriers present in a polycrystalline silicon layer.

As described above, after forming polycrystalline silicon layer 43, the impurities of such as boron contained in first sidewall conductive layers 47 and second sidewall conductive layers 48 are diffused into polycrystalline silicon layer 43 by a thermal treatment. By such a thermal diffusion process, source/drain regions 45, 45 of an LDD structure shown in FIG. 1 are provided.

Figure 8:
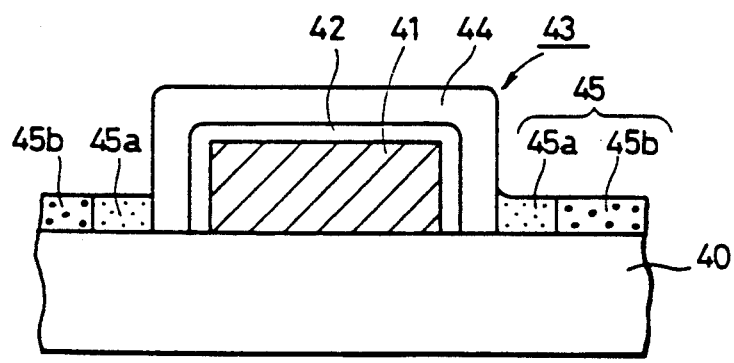
FIG. 8 is a view of a cross-sectional structure of a thin film transistor according to a second embodiment of the present invention.
Figure 9:
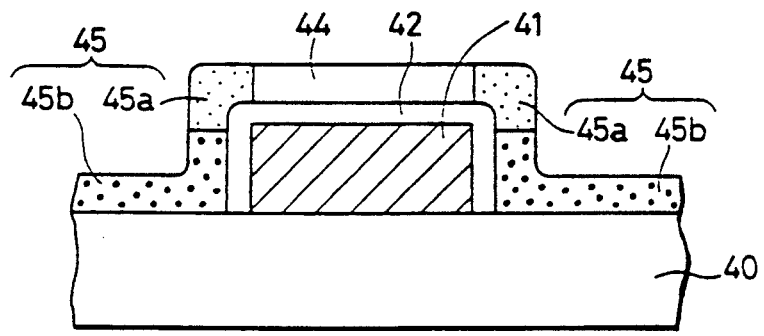
FIG. 9 is a view of a cross-sectional structure of a thin film transistor according to a third embodiment of the present invention.
Figure 10:
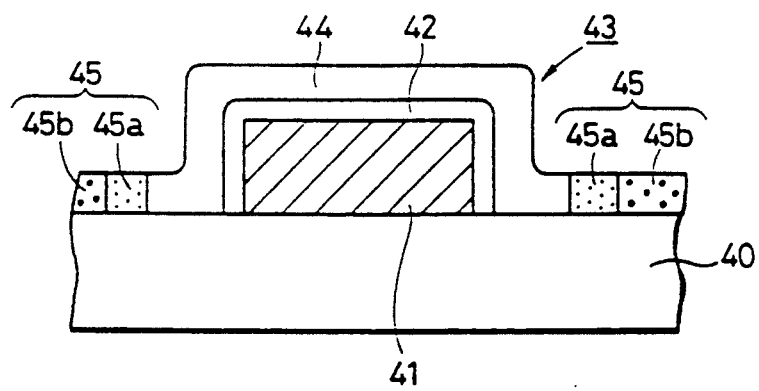
FIG. 10 is a view of a cross-sectional structure of a thin film transistor according to a fourth embodiment of the present invention.

Description will now be made on several embodiments of a thin film transistor provided with source/drain regions of an LDD structure according to the present invention. Referring to FIGS. 8 to 10, in a thin film transistor according to these embodiments, gate insulating layer 42 covers the surface of gate electrode 41 with its thickness almost uniform. However, the positions of source/drain regions 45 formed in polycrystalline silicon layer 43 are different in the respective figures. In a second embodiment shown in FIG. 8, channel region 44 is formed opposing all surfaces of gate electrode 41 including side walls. In a third embodiment shown in FIG. 9, channel region 44 is formed opposing only the upper surface of gate electrode 41. In a fourth embodiment shown in FIG. 10, source/drain regions 45 are formed constituting an offset structure remote from gate electrode 41.

Figure 11:
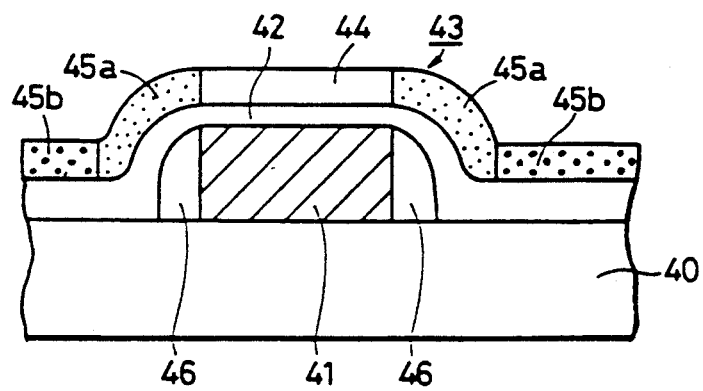
FIG. 11 is a view of a cross-sectional structure of a thin film transistor according to a fifth embodiment of the present invention.

A structure of a thin film transistor according to a fifth embodiment of the present invention is shown in FIG. 11. In the fifth embodiment shown in FIG. 11, sidewall insulating layers 46 are formed on side walls of gate electrode 41. Channel region 44 is formed opposing only the upper surface of gate electrode 41. Such a structure contributes to an increase in thickness of an insulating layer at an edge portion of gate electrode 41, thereby alleviating a field concentration at the portion.

Figure 12:
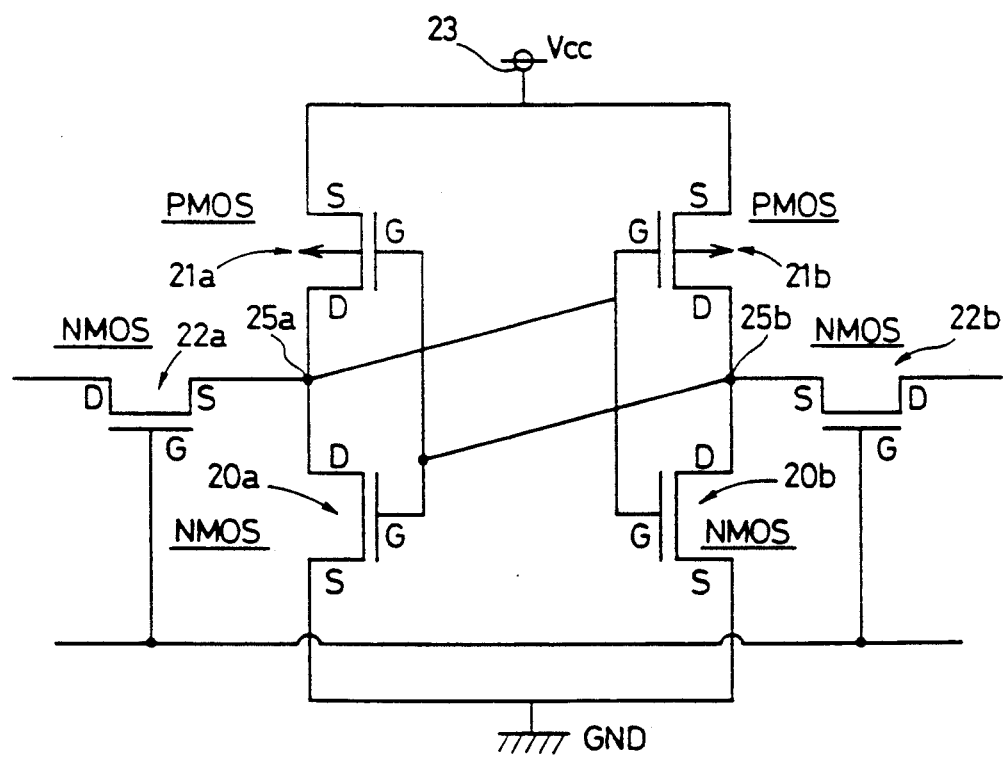
FIG. 12 is an equivalent circuit diagram of an SRAM memory cell using a thin film transistor according to the present invention.

Description will now be made on an SRAM (Static Random Access Memory) structure as an example of a semiconductor device using a thin film transistor shown in the first to fifth embodiments. FIG. 12 is an equivalent circuit diagram of an SRAM memory cell. Referring to FIG. 12, a CMOS-type SRAM memory cell has a pair of CMOS inverters. One CMOS inverter has a drive n-channel MOS transistor 20a and a load p-channel MOS thin film transistor 21a. The other CMOS inverter has a drive n-channel MOS transistor 20b and a load p-channel MOS thin film transistor 21b. Gates of transistors 20a, 21a of one CMOS inverter are cross-connected to a storage node 25b common to transistors 20b, 21b of the other CMOS inverter, and gates of transistors 20b, 21b of the other CMOS inverter are cross-connected to a storage node 25a common to transistors 20a, 21a of one CMOS inverter, thereby implementing a flip-flop circuit. Sources of load p-channel MOS thin film transistors 21a, 21b are connected to a power supply 23. Each of sources of drive n-channel MOS transistors 20a, 20b is grounded.

Figure 13:
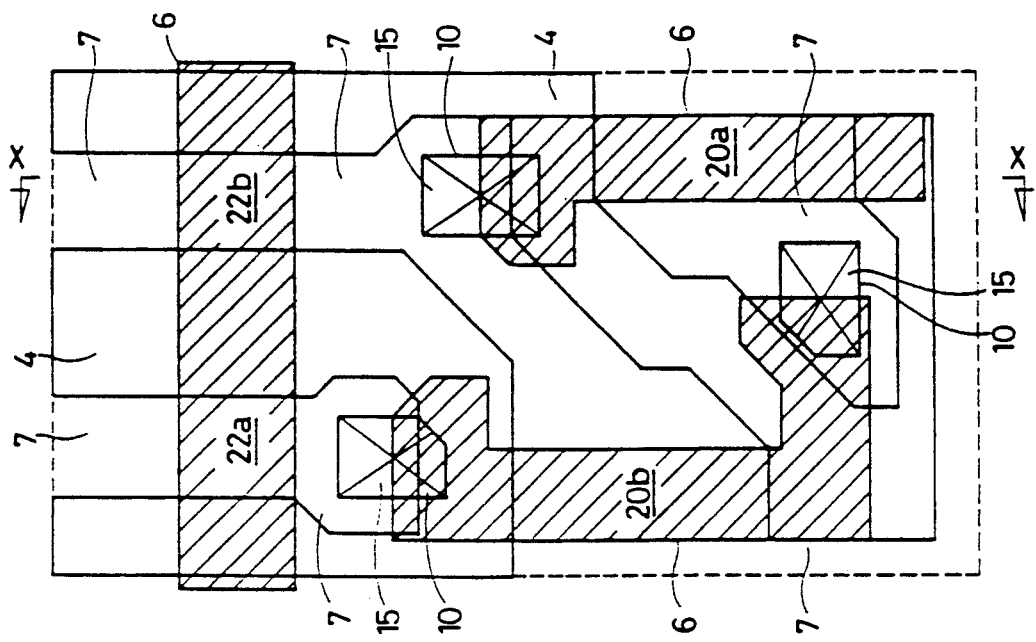
FIG. 13 is a planar structure view showing a planar structure of a lower portion of an SRAM memory cell using a thin film transistor according to the present invention.
Figure 14:
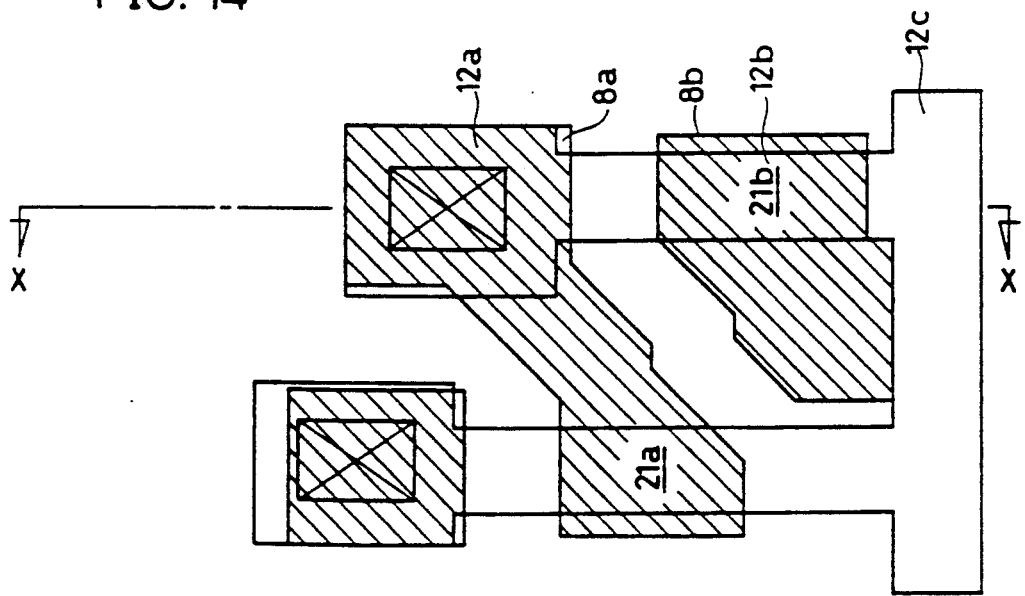
FIG. 14 is a planar structure view showing a planar structure of an upper portion of the same SRAM memory cell as that in FIG. 13.
Figure 15:
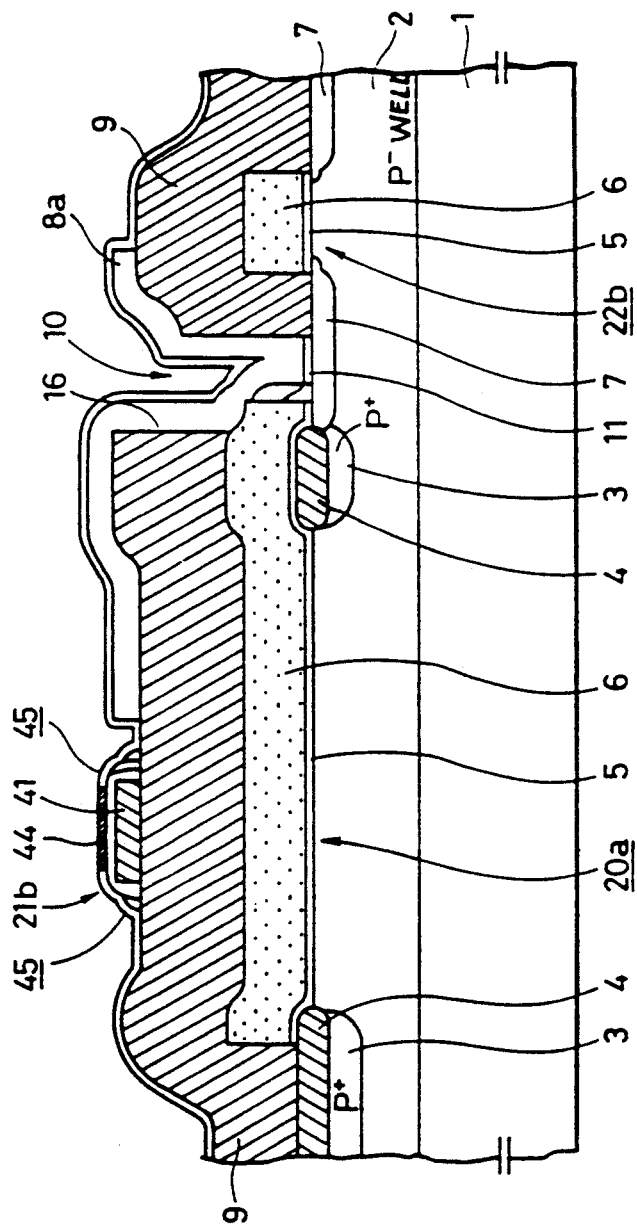
FIG. 15 is a view of a cross-sectional structure of a memory cell taken along the line X—X of FIGS. 13 and 14.
Figure 16:
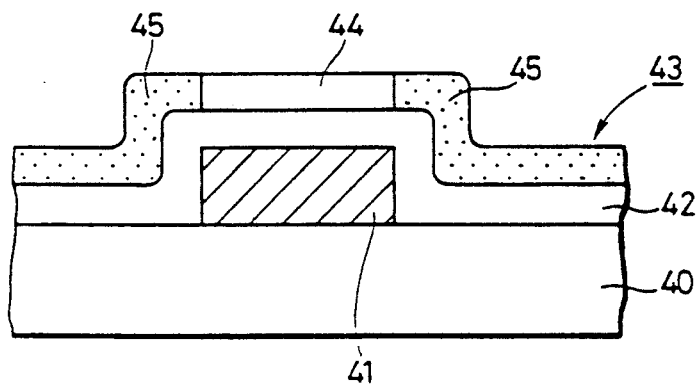
FIG. 16 is a view of a cross-sectional structure of a conventional thin film transistor.
Figure 17:
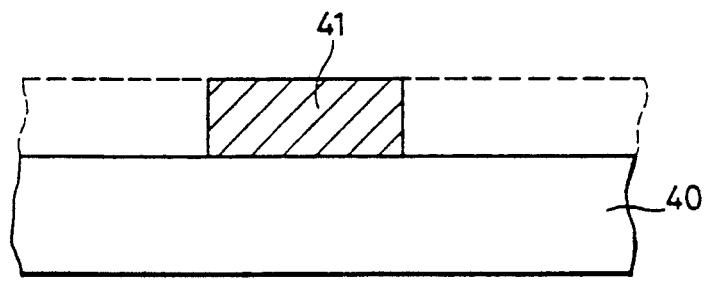
FIGS. 17-20 are views of cross-sectional structures showing in order steps of a manufacturing process of a thin film transistor shown in FIG. 16.
Figure 18:
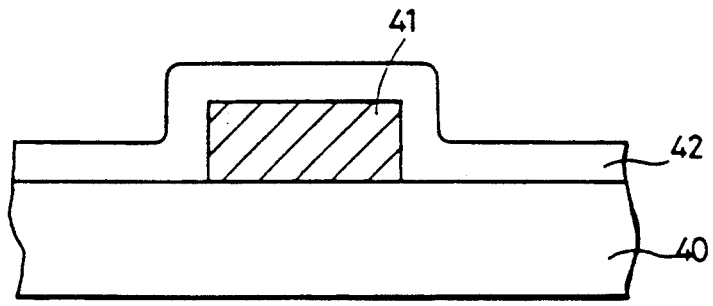
Figure 19:
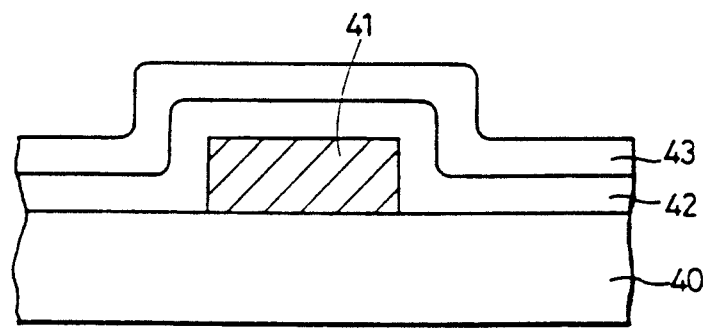
Figure 20:
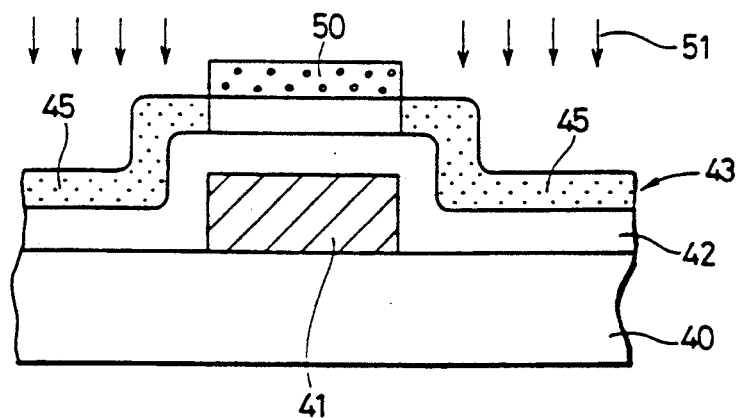

Description will now be made on a specific structure of an SRAM memory cell in conjunction with FIGS. 13 to 15. FIGS. 13 and 14 show views of a planar structure of a memory cell. For facility of description, a memory cell is divided into two parts (the lower and the upper layers of a substrate). FIG. 13 shows a planar structure of the lower region of a memory cell and FIG. 14 shows the upper region of a memory cell. FIG. 15 shows a view of a cross-sectional structure taken along the line X—X in FIGS. 13 and 14. Referring to FIGS. 13 to 15, an SRAM memory cell has drive n-channel MOS transistors 20a, 20b and transfer n-channel MOS transistors 22a, 22b disposed in the lower region close to the surface of silicon substrate 1. Load p-channel MOS thin film transistors 21a, 21b are disposed in the upper region formed on the main surface of silicon substrate 1 with interlayer insulating layer 9 interposed therebetween. A thin film transistor shown in the first to fifth embodiments described above is applied to the load p-channel MOS thin film transistors 21a, 21b.

Referring to FIG. 15, a p-well region 2 is formed on the surface of silicon substrate 1. A device isolation region on the main surface of p-well region 2 includes a field oxide film 4 and a channel stop region 3. Each of drive n-channel MOS transistor 20a and transfer n-channel MOS transistor 22b is provided with n+ source/drain regions 7, 7, a gate oxide film 5 and a gate electrode 6. The surface of silicon substrate 1 is covered with a thick interlayer insulating layer 9. Load p-channel thin film transistor 21b is formed on the surface of interlayer insulating layer 9.

An opening 16 is formed in interlayer insulating layer 9. Gate electrode 6 of drive n-channel MOS transistor 20a and one of n+ source/drain regions 7, 7 of transfer n-channel MOS transistor 22b are exposed inside opening 16. An interconnection layer 8a formed of a polycrystalline silicon layer extends inside opening 16 and is simultaneously connected to gate electrode 6 of drive n-channel MOS transistor 20a and n+ source/drain region 7 of transfer n-channel MOS transistor 22b. A portion of interconnection layer 8a extends on the surface of interlayer insulating layer 9, and is connected to a polycrystalline silicon layer constituting source/drain region 45 of load p-channel MOS thin film transistor 21b.

An advantage of such an SRAM memory cell is that it consumes a lower electric power in a standby state. However, an increase in memory capacitance makes it difficult to maintain a low OFF-current in a standby state. To eliminate such a problem, employment of a thin film transistor as pMOS load makes it possible to obtain the optimal ON-current and OFF-current by transistor operation. Therefore, it becomes possible to further reduce a power consumption by reducing an OFF-current in a standby state. By using a thin film transistor shown in the first to fifth embodiments described above as load of the SRAM, an OFF-current can be reduced by reduction of leakage in a standby state.

As described above, a thin film field effect device according to the present invention makes it possible to alleviate a field concentration and thus to suppress leakage by providing an LDD structure in a source/drain region.

A method of manufacturing a thin film field effect device according to the present invention includes forming a source/drain region of an LDD structure by thermal diffusion of impurities from dual sidewall conductive layers. Therefore, it is possible, without using a complicated step, to manufacture a thin film field effect device having drain leakage suppressed due to alleviation of a field concentration.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A thin film field effect device, comprising:
   an insulating base layer having a surface;
   a gate electrode formed on the surface of said insulating base layer;
   an insulating layer having an upper region covering an upper surface of said gate electrode and side regions covering side surfaces of said gate electrode, a portion of said side region adjacent to said upper region being thicker than a portion of said side region adjacent to said insulating base layer in a direction parallel to the surface of said insulating base layer;
   a polycrystalline silicon layer formed on a surface of said insulating layer and extending to cover said insulating base layer from both sides of said gate electrode;
   a channel region formed in a central portion of said polycrystalline silicon layer; and
   a pair of source/drain regions formed in said polycrystalline silicon layer adjacent said central portion and including a first type impurity region of a lower concentration adjacent said channel region and a first type impurity region of a higher concentration adjacent said impurity region of a lower concentration.

2. A thin film field effect device according to claim 1, wherein said side region of said insulating layer is thicker than said upper region.

3. A thin film field effect device according to claim 1, further comprising:
   a first sidewall conductive film formed adjacent said side region of said insulating layer covering said side surface of said gate electrode and having a first impurity concentration; and
   a second sidewall conductive film formed adjacent said first sidewall conductive film and having a second impurity concentration higher than said first impurity concentration.

4. A thin film field effect device according to claim 3, wherein said impurity region of a lower concentration is formed adjacent said first sidewall conductive film and said impurity region of a higher concentration is formed adjacent said second sidewall conductive film.

5. A thin film field effect device according to claim 1, wherein said insulating layer comprises:
   first insulating layers on said side surfaces of said gate electrode; and
   a second insulating layer on said upper surface of said gate electrode and on surfaces of said first insulating layers.

6. A thin film field effect device according to claim 5, wherein said channel region is formed over said upper surface of said gate electrode and boundaries between said channel region and said impurity region of a lower concentration are aligned with an edge of said gate electrode.

7. A thin film field effect device according to claim 1, wherein boundaries between said channel region and said impurity region of a lower concentration are formed on said base layer remote from said insulating layer.

8. A method of manufacturing a thin film field effect device, comprising the steps of:
   forming on a surface of a base layer a gate electrode having an upper surface and side surfaces;
   forming an insulating layer having an upper region covering the upper surface of said gate electrodes and side regions covering the side surfaces of said gate electrode, a portion of the side region adjacent the upper region being formed thicker than a portion of the side region adjacent the base layer in a direction parallel to the surface of the base layer;
   forming a first sidewall conductive layer on side walls of said insulating layer formed on side walls of said gate electrode by carrying out an anisotropic etching after forming a first conductive layer containing an impurity of a relatively low concentration on the whole surface of said base layer;
   forming a second sidewalls conductive layer on side walls of said first sidewall conductive layer by carrying out an anisotropic etching after forming a second conductive layer containing an impurity of a relatively high concentration on the whole surface of said base layer;
   etching said second sidewall conductive layer using an etching method having a larger selectivity of etching relative to said first sidewall conductive layer, said insulating layer and said base layer
   forming a polycrystalline silicon layer on surfaces of said first and second sidewall conductive layers and said layer; and
   forming in said polycrystalline silicon layer a source/drain region including impurity regions of a lower concentration and of a higher concentration by carrying out a thermal treatment to diffuse an impurity containing in said first and second sidewall conductive layers.

9. A method of manufacturing a thin film field effect device according to claim 8, wherein said step of forming said gate electrode covered with said insulating layer comprises the steps of:
   forming in order conductive layer, insulating layer and silicon nitride layer on said base layer to pattern the layers to a predetermined shape; and
   carrying out a thermal oxidation method to form a thermal oxide film on a patterned side wall of said conductive layer.

10. A method of manufacturing a thin film field effect device according to claim 8, wherein said etching of said second sidewall conductive layer comprises a dry etching method having a larger selectivity of etching relative to a layer with a large impurity content.

11. A method of manufacturing a thin film field effect device according to claim 8, wherein said step of forming a polycrystalline silicon layer comprises the step of forming a polycrystalline silicon layer by a Chemical Vapor Deposition method.

12. A method of manufacturing a thin film field effect device according to claim 8, wherein said step of forming said polycrystalline silicon layer comprises the steps of:

forming an amorphous silicon layer on surfaces of said first and second sidewall conductive layers and said base layer; and polycrystallizing said amorphous silicon layer by carrying out a thermal treatment.

* * * * *